United States Patent
Mizuishi et al.

[11] Patent Number: 5,900,058
[45] Date of Patent: May 4, 1999

[54] APPARATUS FOR PRODUCING SINGLE CRYSTAL

[75] Inventors: Kouji Mizuishi, Annaka, Japan; Atsushi Iwasaki, Vancouver, Wash.

[73] Assignee: Shin-Etsu Handotai Co., Ltd., Tokyo, Japan

[21] Appl. No.: 08/759,224

[22] Filed: Dec. 5, 1996

[30] Foreign Application Priority Data

Dec. 25, 1995 [JP] Japan ................................. 7-350039

[51] Int. Cl.⁶ .................................................. C30B 35/00
[52] U.S. Cl. ........................ 117/208; 117/200; 117/206; 117/216
[58] Field of Search .................................. 117/200, 202, 117/208, 216, 217, 218, 219; 118/715

[56] References Cited

U.S. PATENT DOCUMENTS

| | | |
|---|---|---|
| 5,096,677 | 3/1992 | Katsuoka et al. ........................ 117/217 |
| 5,129,986 | 7/1992 | Seki et al. ................................ 117/202 |
| 5,365,772 | 11/1994 | Ueda et al. ................................ 117/86 |
| 5,667,588 | 9/1997 | Iino et al. ................................ 117/218 |

OTHER PUBLICATIONS

"A Czochralski Silicon Growth Technique Which Reduces Carbon to the Order of 1014 per Cubic Centimeter", Fukuda, et al.; J of Electro Chemical Society; Aug. 1994; vol. 141, No. 8, pp. 2216–2220, Abstract only.

*Primary Examiner*—Felisa Garrett
*Attorney, Agent, or Firm*—Oliff & Berridge, PLC

[57] ABSTRACT

An apparatus for producing a single crystal by the Czochralski method is disclosed in which an exhaust system is provided with a water sealing bubbler. On the upstream side of the bubbler is provided a buffer or a vacuum breaker or a buffer and a vacuum breaker. The structure prevents the sealing water in the bubbler from flowing backward, so that danger of steam explosion can be avoided.

15 Claims, 5 Drawing Sheets

APPARATUS FOR PRODUCING SINGLE CRYSTAL

TECHNICAL FIELD

The present invention relates to an apparatus for producing a single crystal by the Czochralski method comprising an exhaust system provided with a water sealing bubbler, which is capable of preventing danger of steam explosion due to the sealing water flowing backward.

BACKGROUND OF THE INVENTION

In producing a single crystal by the Czochralski method (hereinafter, referred to as "the CZ method"), a single crystal is pulled in an atmosphere inside of a chamber which is maintained at around an atmospheric pressure, for example, a slight pressure of tens to hundreds of millimeters in height by a column of water (hereinafter, referred to as "the atmospheric pressure method") or in an atmosphere inside of a chamber which is maintained under vacuum or at a reduced pressure by a vacuum pump (hereinafter, referred to as "the reduced pressure method").

In recent years, a water sealing bubbler has been used in an exhaust system in both of the above-mentioned pulling methods.

For example, a typical conventional apparatus for producing a single crystal by the atmospheric pressure method is shown in FIG. 4. In the atmospheric pressure method, before the start of pulling a single crystal, a chamber 1 is evacuated by removing air therein by a vacuum pump 2, and then a valve 3 for the vacuum pump 2 is closed, and after that a valve 4 for an argon gas is opened and the chamber 1 is filled with an argon gas. When the pressure inside of the chamber 1 reaches at a slight pressure of tens of millimeters in height by a column of water, a main valve 16 is opened to discharge the argon gas from the chamber 1. At this time, the argon gas is discharged through a water sealing bubbler 5 which holds sealing water 10 in order to maintain the pressure inside of the chamber 1 at a defined pressure (a pressure of tens to hundreds of millimeters in height by a column of water) and to prevent the air from flowing backward into the chamber 1. The pressure inside of the chamber 1 is dependent on the dipped length L of a pipe 6 which is inserted in the sealing water 10 in the bubbler 5.

The pulling of a single crystal is carried out while maintaining such a slight pressure. In order to take out the produced single crystal or exchange a single crystal seed with another one, a pulling chamber 7 must be opened after closing an isolation valve 9. At this time, the flow of the argon gas is changed so as to enter a main chamber 8 below the isolation valve 9 and the inside of the main chamber 8 is maintained at the slight pressure. When such a procedure as taking out the crystal, etc. is finished and a procedure of pulling a single crystal is started again, the pulling chamber 7 is evacuated by removing air therein by the vacuum pump 2 and then is filled with an argon gas. After the inside of the pulling chamber 7 is replaced with an argon gas, the isolation valve 9 is opened and then a procedure of pulling a single crystal is started again.

If by some accident a leakage occurs in the isolation valve 9 in a procedure of evacuating the pulling chamber 7, the inside of the main chamber 8 is also evacuated and the sealing water 10 in the bubbler 5 flows backward into the main chamber 8 through the pipe 6. When such an accident occurs, the water which has flowed backward into the main chamber 8 is evaporated in a moment because the main chamber 8 has a high temperature, which invites danger of steam explosion.

Regarding the reduced pressure method, a vacuum pump used in the conventional reduced pressure method is, for example, an oil-sealed rotary vacuum pump or a water ring type vacuum pump, which have the following disadvantages, respectively:

Since the oil-sealed rotary vacuum pump employs oil, oil mist is contained in an exhaust gas. The exhaust gas is discharged in the air, which leads to air pollution. Therefore, in case of using the oil-sealed rotary vacuum pump, an equipment for treatment of the exhaust gas in a large scale is necessary, which causes an increase in cost, and it is not possible to recover the exhaust gas and recycle the argon gas therein due to the oil mist. On the other hand, the water ring type vacuum pump requires a large amount of water and consumes a high electric power, which also causes an increase in cost.

Accordingly, a dry vacuum pump has been employed in recent years. When the dry vacuum pump is used, the above-mentioned disadvantages of the oil-sealed rotary vacuum pump or the water ring type vacuum pump in the conventional apparatus for producing a single crystal by the reduced pressure method can be avoided. However, when a single crystal is pulled by the CZ method by using the dry vacuum pump, the exhaust gas is discharged in a dry condition, which invites danger of dust explosion in cases where pulverized reaction products included in the exhaust gas, for example, SiO or $SiO_2$ when a silicon single crystal is pulled, have been deposited on the inside wall of the exhaust pipe. Therefore, it is necessary to install a water sealing bubbler, for example, on the downstream side of the dry vacuum pump to make the exhaust gas moist.

FIG. 5 is a schematic illustration of a conventional apparatus for producing a single crystal by the reduced pressure method by using a dry vacuum pump. In such a conventional apparatus for producing a single crystal by using a dry vacuum pump 11 as shown in FIG. 5, when the dry vacuum pump 11 is stopped in pulling a single crystal in case of emergency, for example, a problem of the pump or a power failure, the sealing water 10 in the bubbler 5 flows backward through the pipe 6 into the chamber 1 because the inside of the chamber 1 is in vacuum or at a reduced pressure, and the backward flowing water is evaporated in a moment in the chamber 1 having a high temperature, which invites danger of steam explosion, similarly to in the atmospheric pressure method.

In order to deal with the above mentioned problems, in a conventional apparatus for producing a single crystal in which a dry vacuum pump is used, some way of preventing the sealing water from flowing backward is used, for example, a check valve 12 is installed on the upstream side of the bubbler 5. However, pulverized reaction products, for example, SiO or $SiO_2$ when a silicon single crystal is pulled, are included in the exhaust gas by the CZ method, as described above. This leads to incompleteness of the sealing effect of the check valve 12 which results in a leak, and as a result, it is not possible to completely prevent the sealing water from flowing backward.

Apparatuses for producing a single crystal become larger with a single crystal material such as a semiconductor single crystal rod being larger in diameter. Once an accident such as steam explosion happens, the manufactures of single crystals will suffer a deathblow. The present invention was made in view of foregoing problems, and therefore an object of the present invention is to provide an apparatus for producing a single crystal wherein an exhaust system has a water sealing bubbler, which is capable of avoiding danger of steam explosion by taking an easy and reliable way of preventing the sealing water in the bubbler from flowing backward.

SUMMARY OF THE INVENTION

The present invention provides an apparatus for producing a single crystal by the Czochralski method, comprising:

a chamber in which a single crystal is pulled, an exhaust system for discharging an exhaust gas from the chamber, the exhaust system having a water sealing bubbler, and a buffer which is provided between the chamber and the bubbler.

Furthermore, the present invention provides an apparatus for producing a single crystal by the Czochralski method, comprising:

a chamber in which a single crystal is pulled, an exhaust system for discharging an exhaust gas from the chamber, the exhaust system having a water sealing bubbler, and a vacuum breaker which is provided between the chamber and the bubbler.

Moreover, the present invention provides an apparatus for producing a single crystal by the Czochralski method, comprising:

a chamber in which a single crystal is pulled, an exhaust system for discharging an exhaust gas from the chamber, the exhaust system having a water sealing bubbler, and a buffer and a vacuum breaker which are provided between the chamber and the bubbler. In this case, the vacuum breaker is preferably connected to the buffer.

In the apparatus according to the present invention, the chamber is in general separated into a pulling chamber and a main chamber by an isolation valve. Furthermore, the apparatus according to the present invention can be provided with a vacuum pump such as a dry vacuum pump between the chamber and the exhaust system, if necessary.

In the above apparatus according to the present invention, a silicon single crystal is preferably produced.

As described above, the first apparatus for producing a single crystal according to the present invention is provided with a buffer between a chamber and a water sealing bubbler. Even if a leakage occurs in the isolation valve in a procedure of evacuating the pulling chamber, the sealing water flowing backward from the bubbler due to the inside of the main chamber being in vacuum or at a reduced pressure is trapped by the buffer and does not reach the main chamber having a high temperature, or, even if the vacuum pump is stopped in pulling a single crystal in case of emergency for any reason, the sealing water flowing backward from the bubbler due to the inside of the chamber being in vacuum or at a reduced pressure is trapped by the buffer and does not reach the chamber having a high temperature, so that the danger of steam explosion is avoided.

The second apparatus for producing a single crystal is provided with a vacuum breaker between a chamber and a bubbler. Even if a leakage occurs or the vacuum pump is stopped, the condition of vacuum or a reduced pressure inside of the main chamber or the chamber is broken and is changed to the condition of the atmospheric pressure in a short time to prevent the sealing water from flowing backward into the main chamber or the chamber.

The third apparatus for producing a single crystal is provided with a buffer and a vacuum breaker. Even if a leakage occurs or the vacuum pump is stopped, the backward flowing of sealing water is trapped by the buffer and the atmospheric pressure of the inside of the main chamber or the chamber and the buffer can be obtained in a short time by the vacuum breaker, so that the flowing backward of the sealing water can be more easily and reliably prevented.

According to the present invention, the danger of steam explosion of an apparatus for producing a single crystal, which becomes larger in recent years, can be avoided and the safety of the apparatus is secured.

BRIEF DESCRIPTION OF THE DRAWINGS

The above and other objects and features of the invention will appear more fully hereinafter from the following description of embodiments with reference to the accompanying drawings in which.

DETAILED DESCRIPTION OF THE INVENTION

The present invention will be described in further detail by way of example in case where a semiconductor silicon single crystal is produced from silicon melt by the CZ method with reference to the accompanying drawings, and is not limited to the description. The present invention can apply to all apparatuses for producing a single crystal, for example, not only a semiconductor silicon single crystal, but also a compound semiconductor single crystal, oxide single crystal, etc. by the CZ method wherein a water sealing bubbler is used in an exhaust system.

Figure 1:
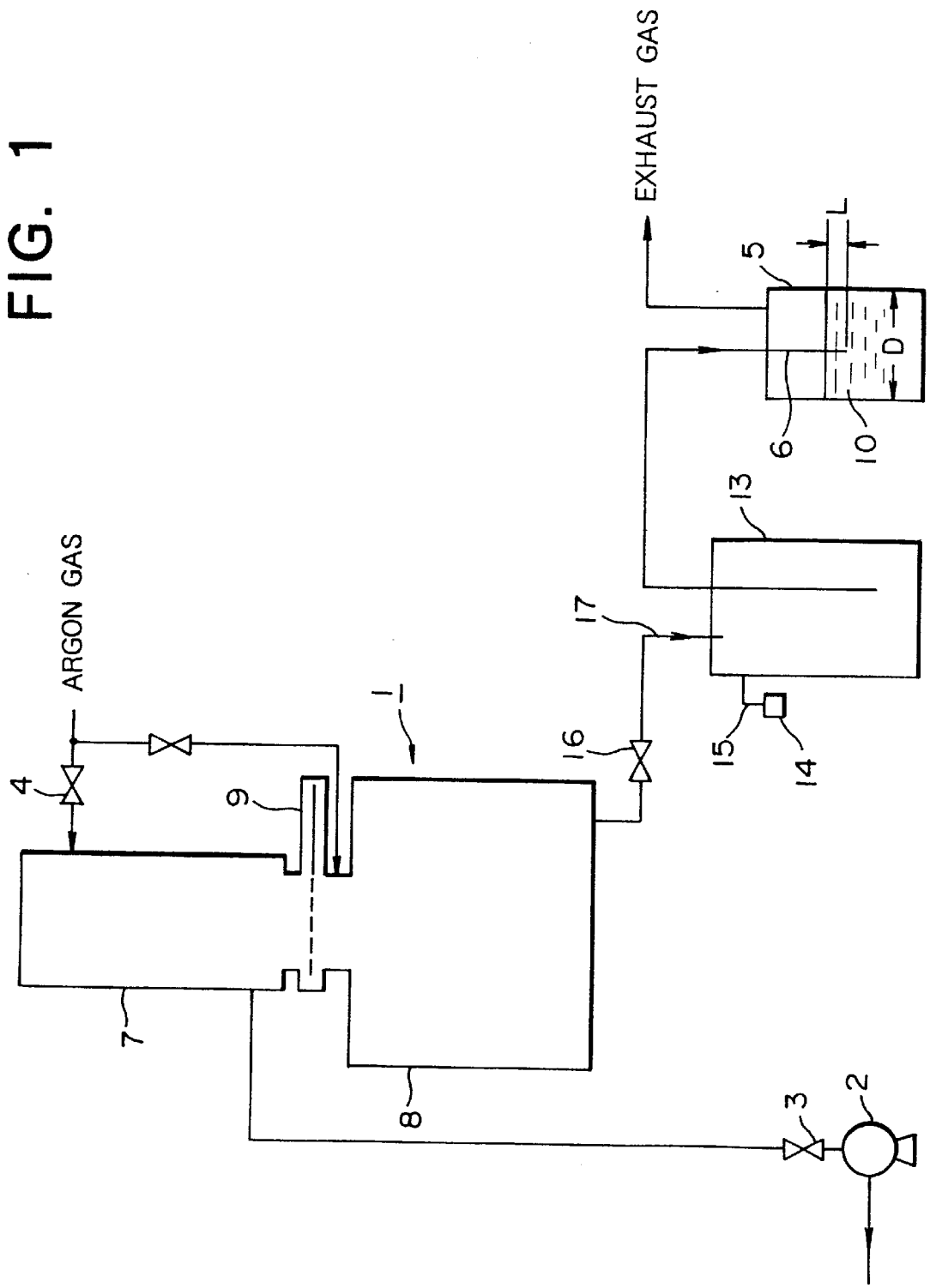
FIG. 1 is a schematic illustration of an embodiment of an apparatus for producing a single crystal by the atmospheric pressure method according to the present invention.

FIG. 1 is a schematic illustration of an embodiment of an apparatus for producing a single crystal by the atmospheric pressure method according to the present invention. The apparatus comprises a chamber 1 which can be divided into a pulling chamber 7 and a main chamber 8 by an isolation valve 9, an exhaust system for discharging the exhaust gas from the chamber 1, which is provided with a water sealing bubbler 5 which holds sealing water 10, and a buffer 13. A valve 4 for argon gas is connected to the upper portion of the pulling chamber 7 and a main valve 16 is connected to the bottom portion of the main chamber 8. A vacuum pump 2 is further connected to the pulling chamber 7 and a valve 3 for the vacuum pump 2 is provided therebetween. The chamber 1 and the buffer 13, and, the buffer 13 and the bubbler 5 are connected via pipes 17 and 6, respectively. The exhaust gas from the chamber 1 is discharged through the pipe 17, the buffer 13, the pipe 6 and the bubbler 5. In the main chamber is provided a crucible (not illustrated) which accommodates a melt therein.

In the atmospheric pressure method, before the start of pulling a single crystal from the melt, the chamber 1 is evacuated by removing air therein by the vacuum pump 2, and then the valve 3 is closed, and after that the valve 4 is opened and the chamber 1 is filled with an argon gas. When the pressure inside of the chamber 1 is arrived at a slight pressure of tens of millimeters in height by a column of water, a main valve 16 is opened to discharge the argon gas from the chamber 1. At this time, the argon gas is discharged through the bubbler 5 holding the sealing water 10 in order to maintain the pressure inside of the chamber 1 at a defined pressure (a pressure of tens to hundreds of millimeters in height by a column of water) and to prevent the air from flowing backward into the chamber 1. In the bubbler 5, a pipe 6 is inserted into the sealing water 10 at a dipped length L in order to maintain the pressure inside of the chamber 1. The pressure inside of the chamber 1 is dependent on the dipped length L.

The pulling of a single crystal is carried out with maintaining such a slight pressure. In order to take out the produced single crystal or exchange a single crystal seed to another one, the pulling chamber 7 must be opened after closing the isolation valve 9. At this time, the flow of an argon gas is changed so as to enter the main chamber 8 below the isolation valve 9 and the inside of the main chamber 8 is maintained at the slight pressure. When such a procedure as taking out the crystal, etc. is finished and a procedure of pulling a single crystal is started again, the pulling chamber 7 is evacuated by removing air therein by the vacuum pump 2 and then is filled with an argon gas. After the inside of the pulling chamber 7 is replaced with an argon gas, the isolation valve 9 is opened and then a procedure of pulling a single crystal is started again.

If a leakage occurs in the isolation valve 9 when evacuating the pulling chamber 7, the inside of the main chamber 8 is also evacuated and the sealing water 10 in the bubbler 5 flows backward. In this case, the sealing water 10 flows into the buffer 13 and is trapped therein. The volume of the backward flowing sealing water is represented as $\pi D^2 L/4$, in which D is an inside diameter of the bubbler 5 and L is a length of the pipe 6 dipped into the sealing water. Therefore, the volume of the buffer 13 must be sufficiently larger than that of the backward flowing sealing water, preferably is equal or larger than the volume of the entire sealing water in view of safety. The pipe 17 for introducing the exhaust gas into the buffer 13 is inserted into the buffer 13 from the ceiling thereof, and the end part of the pipe 17 should be in the vicinity of the ceiling. The pipe 17 should not be inserted deeply into the buffer 13, in particular, more deeply than the pipe 6 for allowing the exhaust gas to flow from the buffer. The reason thereof is that if the pipe 17 is inserted deeply into the buffer 13 the sealing water trapped in the buffer furthermore flows backward into the main chamber 8.

The buffer 13 can be positioned anywhere in the exhaust system provided that the buffer is positioned on the upstream side of the bubbler 5, that is, between the chamber 1 and the bubbler 5, but preferably close to the bubbler 5. The buffer 13 must have a volume capable of trapping the sealing water 10 which may flow backward, but the shape of the buffer 13 is not limited, and it may be, for example, drum-shaped or spherical.

Even if the sealing water in the bubbler flows backward in operation in the apparatus according to the present invention, the backward flowing water can be completely trapped by the buffer, so that the danger of steam explosion can be avoided.

Figure 2:
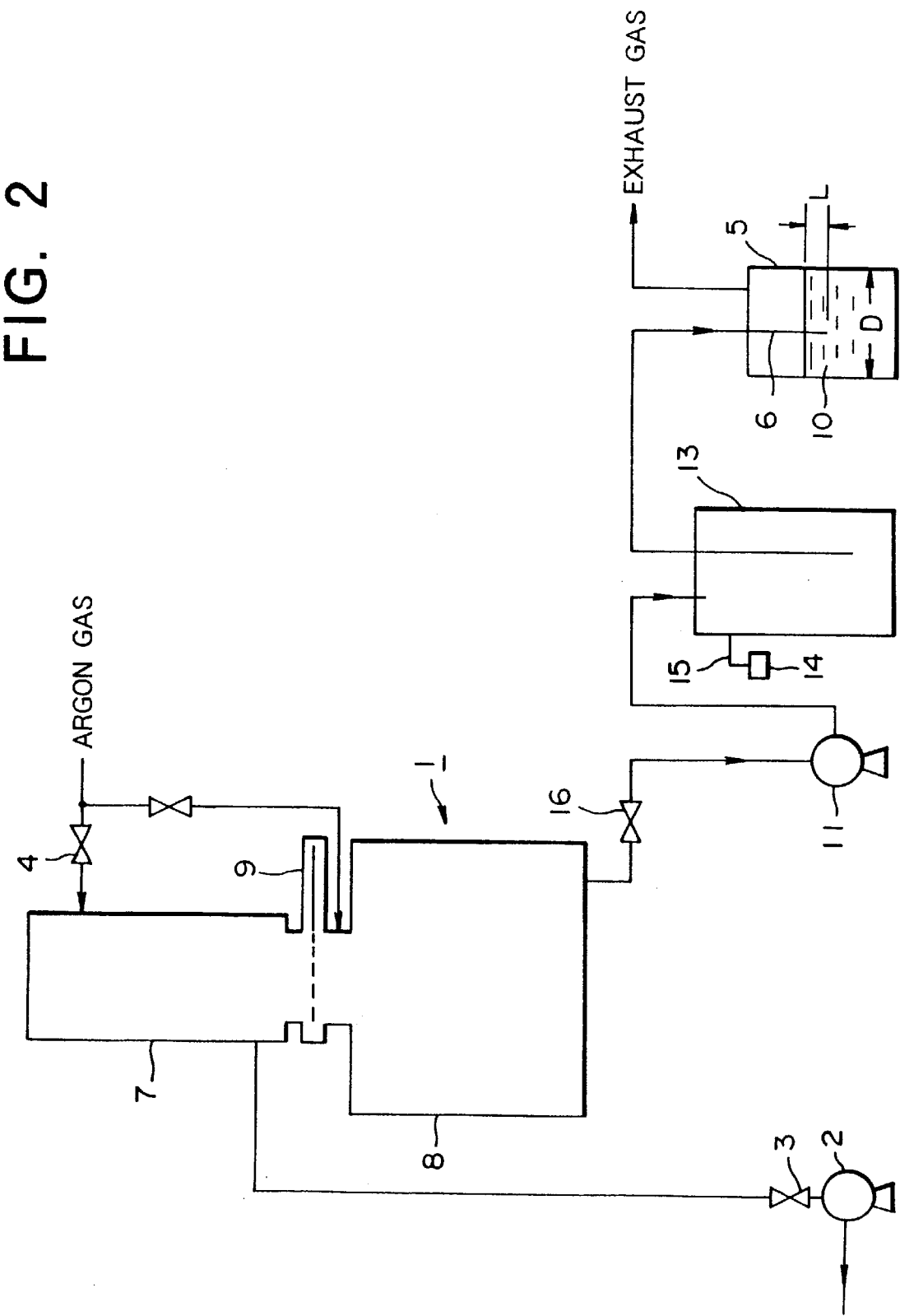
FIG. 2 is a schematic illustration of an embodiment of an apparatus for producing a single crystal by the reduced pressure method according to the present invention.

FIG. 2 is a schematic illustration of an embodiment of an apparatus for producing a single crystal by the reduced pressure method according to the present invention. The apparatus comprises mainly a chamber 1 which can be divided into a pulling chamber 7 and a main chamber 8 by an isolation valve 9, a vacuum pump 11 such as a dry vacuum pump for evacuating the chamber 1, an exhaust system for discharging the exhaust gas from the chamber 1, which is provided with a water sealing bubbler 5 which holds sealing water 10, and a buffer 13. The bubbler gives moisture to the exhaust gas to prevent dust explosion. The buffer 13 prevents the sealing water 10 from flowing backward into the chamber 1 and traps the sealing water 10 if the vacuum pump 11 is stopped due to a power failure, etc. in operation of pulling a single crystal. The buffer 13 can be positioned anywhere in the exhaust system provided that the buffer is positioned on the upstream side of the bubbler 5, that is, between the vacuum pump 11 and the bubbler 5. According to the apparatus, the flowing backward of the sealing water can be also easily and reliably prevented in the reduced pressure method, similarly to in the atmospheric pressure method.

In a preferred embodiment of the present invention, the exhaust system is provided with a vacuum breaker 14 which is positioned on the upstream side of the bubbler 5. Even if the sealing water 10 starts flowing backward in operation, the condition of vacuum in the main chamber 8 or the chamber 1 is broken by the air flowing into it from the vacuum breaker 14 and changed to the condition of the atmospheric pressure in a short time to prevent the sealing water 10 from flowing backward into the main chamber or the chamber.

Both of the buffer and the vacuum breaker can be provided for the exhaust system in the apparatus for producing a single crystal by the CZ method, this leading to the further increase of safety. In this case, the arrangement and order thereof are not limited and can be selected properly. For example, the vacuum breaker 14 can be connected to the buffer 13 via a pipe 15, as shown in FIGS. 1 and 2.

Figure 3:
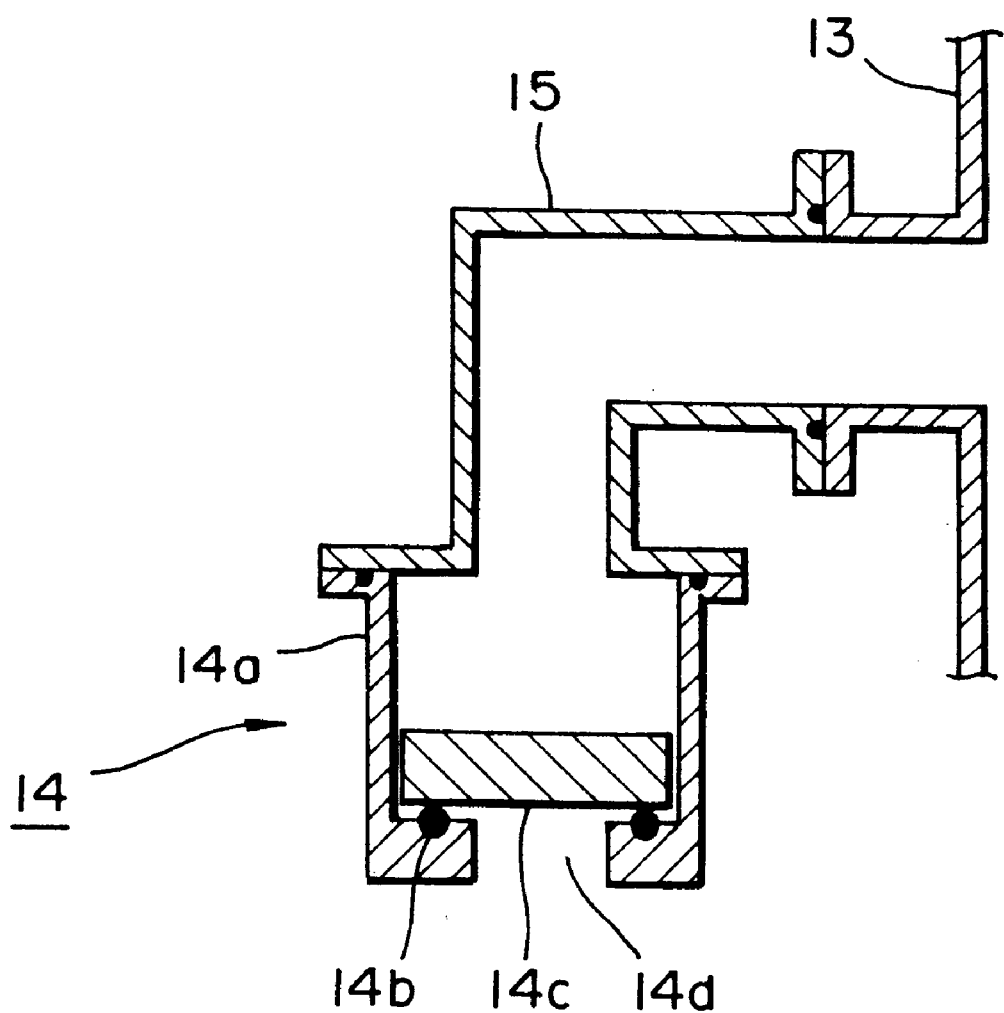
FIG. 3 is a sectional view of an embodiment of a gravity type vacuum breaker.
Figure 4:
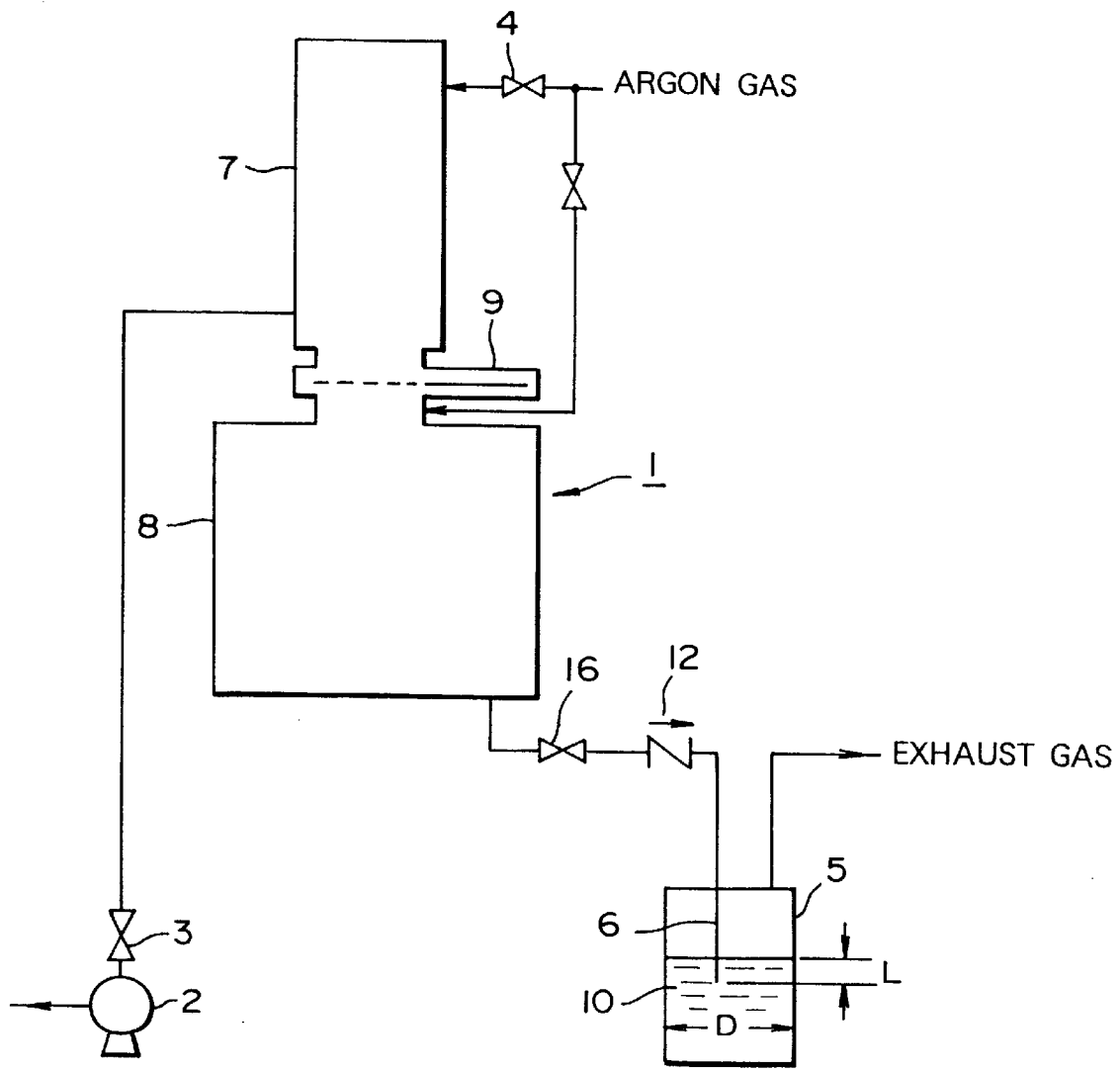
FIG. 4 is a schematic illustration of a conventional apparatus for producing a single crystal by the atmospheric pressure method.
Figure 5:
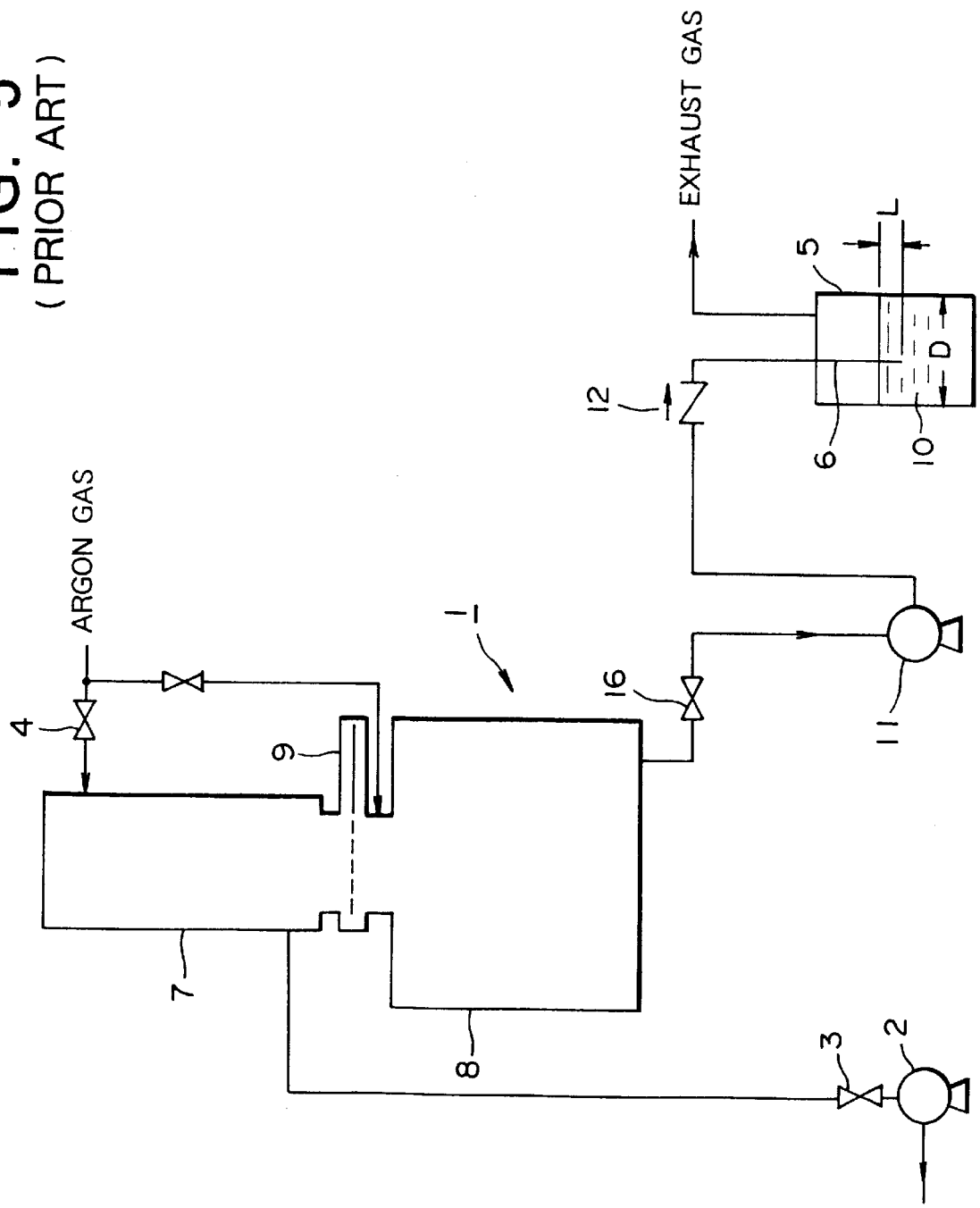
FIG. 5 is a schematic illustration of a conventional apparatus for producing a single crystal by the reduced pressure method employing a dry vacuum pump.

It is desirable to use a vacuum breaker 14 having such a gravity type structure as shown in FIG. 3 in the apparatus of the present invention. The reason thereof is that one of the causes of the sealing water flowing backward is a power failure and an electric type vacuum breaker does not work on the power failure.

FIG. 3 shows a typical structure of a gravity type vacuum breaker 14. As shown in FIG. 3, an O-ring 14b is embedded in a body 14a of the vacuum breaker and a sealing plate 14c is inserted into the body 14a. The inside of the buffer 13 is isolated from the outside thereof by the weight of the sealing plate 14c.

When the main chamber 8 or the chamber 1 is evacuated for the reason that in the atmospheric pressure method the leakage in the isolation valve, etc. occurs or in the reduced pressure method a dry pump is stopped in case of emergency for a power failure, etc., and as a result the inside of the buffer 13 is also evacuated, the sealing plate 14c is drawn upward due to the difference of pressures between the inside and the outside of the buffer so that the air flows into the buffer through an opening 14d, the atmospheric pressure inside of the buffer 13 being obtained. Since the buffer 13 is provided on the upstream side of the bubbler 5, the flowing backward of the sealing water in the bubbler is prevented if the atmospheric pressure inside of the buffer 13 is obtained.

Any vacuum breakers having different structures, which have the same functions, can be used as a vacuum breaker in the apparatus according to the present invention, and the vacuum breaker 14 can be positioned anywhere in the exhaust system provided that the vacuum breaker is positioned on the upstream side of the bubbler 5, that is, between the chamber 1 and the bubbler 5 or the vacuum pump 11 and the bubbler 5.

What is claimed is:

1. An apparatus for producing a single crystal by the Czochralski method, comprising:
    a chamber in which a single crystal is pulled,
    an exhaust system for discharging gas from the chamber, the exhaust system having a water sealing bubbler, and
    a buffer disposed between the chamber and the water sealing bubbler.

2. The apparatus according to claim 1, further comprising a vacuum pump disposed between the chamber and the buffer.

3. The apparatus according to claim 1, wherein the single crystal to be produced is a silicon single crystal.

4. The apparatus according to claim 1, wherein the water sealing bubbler contains sealing water, and the buffer prevents the sealing water from flowing in a backward direction of the exhaust system into the chamber.

5. An apparatus for producing a single crystal by the Czochralski method, comprising:
    a chamber in which a single crystal is pulled,
    an exhaust system for discharging gas from the chamber, the exhaust system having a water sealing bubbler, and
    a vacuum breaker disposed between the chamber and the water sealing bubbler.

6. The apparatus according to claim 3, further comprising a vacuum pump disposed between the chamber and the vacuum breaker.

7. The apparatus according to claim 5, wherein the single crystal to be produced is a silicon single crystal.

8. The apparatus according to claim 5, wherein the vacuum breaker is gravity actuated.

9. The apparatus according to claim 5, wherein the water sealing bubbler contains sealing water, and the vacuum breaker increases the pressure in the chamber to prevent the sealing water from flowing in a backward direction of the exhaust system into the chamber.

10. An apparatus for producing a single crystal by the Czochralski method, comprising:
    a chamber in which a single crystal is pulled,
    an exhaust system for discharging gas from the chamber, the exhaust system having a water sealing bubbler, and
    a buffer and a vacuum breaker disposed between the chamber and the water sealing bubbler.

11. The apparatus according to claim 10, wherein the vacuum breaker is connected to the buffer.

12. The apparatus according to claim 11, further comprising a vacuum pump disposed between the chamber and the buffer.

13. The apparatus according to claim 10, wherein the single crystal to be produced is a silicon single crystal.

14. The apparatus according to claim 10, wherein the vacuum breaker is gravity actuated.

15. The apparatus according to claim 10, wherein the water sealing bubbler contains sealing water, and the vacuum breaker increases the pressure inside of the buffer in response to the inside of the buffer being evacuated, so as to prevent the sealing water from flowing in a backward direction of the exhaust system into the chamber.

* * * * *